US012728471B2

(12) United States Patent
Lee et al.

(10) Patent No.: US 12,728,471 B2
(45) Date of Patent: Sep. 8, 2026

(54) TABBING DEVICE FOR MANUFACTURING SOLAR BATTERY MODULE

(71) Applicant: HANWHA SOLUTIONS CORPORATION, Seoul (KR)

(72) Inventors: Min Su Lee, Seoul (KR); Keun Hwan Kwon, Seoul (KR); Deog Su Jang, Seoul (KR)

(73) Assignee: HANWHA SOLUTIONS CORPORATION, Seoul (KR)

( * ) Notice: Subject to any disclaimer, the term of this patent is extended or adjusted under 35 U.S.C. 154(b) by 0 days.

(21) Appl. No.: 19/103,846

(22) PCT Filed: Feb. 24, 2023

(86) PCT No.: PCT/KR2023/002649

§ 371 (c)(1),
(2) Date: Feb. 14, 2025

(87) PCT Pub. No.: WO2024/048880

PCT Pub. Date: Mar. 7, 2024

(65) Prior Publication Data

US 2026/0048448 A1 Feb. 19, 2026

(30) Foreign Application Priority Data

Aug. 31, 2022 (KR) ........................ 10-2022-0109666

(51) Int. Cl.
*B23K 3/08* (2006.01)
*B23K 101/36* (2006.01)
*H10F 71/00* (2025.01)

(52) U.S. Cl.
CPC ......... *B23K 3/085* (2013.01); *H10F 71/1375* (2025.01); *B23K 2101/36* (2018.08)

(58) Field of Classification Search
None
See application file for complete search history.

(56) References Cited

U.S. PATENT DOCUMENTS 4,534,502 A * 8/1985 Piurek .................. H10F 19/902 228/49.5
6,841,728 B2 * 1/2005 Jones ................. H10F 71/1375 29/730

(Continued)

FOREIGN PATENT DOCUMENTS

EP 2005487 B1 6/2011
JP 2012-204536 A 10/2012

(Continued)

OTHER PUBLICATIONS

International Search Report, dated Jun. 8, 2023.

*Primary Examiner* — Devang R Patel
(74) *Attorney, Agent, or Firm* — Harvest IP Law, LLP

(57) ABSTRACT

Provided is a tabbing device for manufacturing a solar battery module, which is capable of preventing over-soldering and under-soldering from occurring in the tabbing device for performing soldering during manufacture of a solar battery module, wherein the tabbing device for manufacturing a solar battery module includes: a solar battery module cell transported by cell unit along conveyor transport equipment; a soldering head provided on an upper side of the solar battery module cell and having embedded therein a heat source configured to provide heat to solder flux coated on the solar battery module cell being transported; a cooling unit installed to be positioned outside the soldering head, and configured to discharge cooling fluid to a lower position of the soldering head and cool the soldering head; and a control unit configured to control operations of the cooling unit and the soldering head in a case where transportation of the solar battery module cell is stopped, wherein, when the transportation of the solar battery module cell is stopped, the control unit operates the cooling unit to provide the cooling fluid and when restarting, stops the operation of the cooling unit and controls the temperature of (Continued)

the heat source to be increased to a predetermined temperature until all of the solar battery module cells in the offset section pass through the lower part of the soldering head.

9 Claims, 3 Drawing Sheets

(56) References Cited

U.S. PATENT DOCUMENTS

| | | | | |
|---|---|---|---|---|
| 8,052,036 | B2 * | 11/2011 | Chikaki | B23K 1/0008 156/583.91 |
| 2003/0127124 | A1 | 7/2003 | Jones | |
| 2010/0047954 | A1 * | 2/2010 | Su | B23K 26/364 118/620 |

FOREIGN PATENT DOCUMENTS

| | | | | |
|---|---|---|---|---|
| JP | 2016-32019 A | 3/2016 | | |
| KR | 10-2010-0113811 A | 10/2010 | | |
| KR | 10-2010-0125987 A | 12/2010 | | |
| KR | 10-2013-0019709 A | 2/2013 | | |
| KR | 10-2018-0084454 A | 7/2018 | | |
| KR | 10-2019-0029625 | 3/2019 | | |
| WO | WO-9617387 A1 * | 6/1996 | | H10F 71/1375 |

* cited by examiner

TABBING DEVICE FOR MANUFACTURING SOLAR BATTERY MODULE

CROSS-REFERENCE TO RELATED APPLICATION(S)

This application is a National Stage of International Application No. PCT/KR2023/002649 filed on Feb. 24, 2023, claiming priority based on Korean Patent Application No. 10-2022-0109666 filed on Aug. 31, 2022, the disclosure of which is incorporated herein by reference in its entirety.

TECHNICAL FIELD

The present disclosure relates to a tabbing device for manufacturing a solar battery module, and more particularly, to a tabbing device for manufacturing a solar battery module, which may prevent over-soldering or under-soldering from occurring in the tabbing device for performing soldering during the manufacture of a solar battery module.

BACKGROUND ART

The search for new energy sources has been accelerated worldwide, and from among such energy sources, renewable energy has received attention for environmental friendliness thereof compared to other power generation methods. In order to convert unlimited and pollution-free solar energy into electrical energy, solar battery cells that convert solar energy into electrical energy are needed.

The solar battery cells are manufactured by forming semiconductor materials into p-n junctions by using diffusion methods and use photoelectric effects which cause a small amount of current to flow when exposed to light, and most of common solar battery cells include large-area p-n junction diodes and when electromotive forces generated at both ends of the p-n junction diodes are connected to external circuits, operate as unit solar batteries.

However, individual solar batteries have been manufactured in shapes of thin plates, and each of the solar batteries has been improved with a output value that gradually increases. In order to obtain desired outputs for power generation, respective solar batteries need to be connected in series in a certain quantity or more to integrate outputs into desired values and here, technology for condensing sunlight is needed.

Solar batteries are manufactured by using single-crystal or polycrystalline silicon substrates and are vulnerable to physical impact and external air, and thus, layer structures capable of protecting are needed.

A series of processes described above may refer to solar battery module manufacturing processes, and the solar battery module manufacturing processes may be largely divided into five processes including cell test, tabbing-string, layup, lamination, and module test.

First, in the cell test process, cells having various electrical properties are tested and then classified into cells having similar electrical properties, and in the second tabbing-string process, conductive ribbons are alternately bonded to front surfaces and back surfaces of solar batteries to connect the solar batteries in series. In the third layup process, a row of solar batteries manufactured in the string process are arranged horizontally again to create a desired shape, and then low-iron tempered glass, EVA, back sheets, and the like are laminated. In the fourth lamination process, laminated solar battery module materials are vacuum-pressed at high temperatures to allow solar battery modules to be impact-resistant and waterproof. Finally, in the module test process, whether or not completed solar battery modules may implement outputs normally is verified.

Here, tabbing refers to bonding solar batteries and ribbons, string refers to arranging solar batteries in a row, and the tabbing process may be described in more detail as follows.

The tabbing process refers to connecting (+) polarities and (−) polarities of multiple cells in series, the (−) polarity of one cell and the (+) polarity of a next cell need to be connected sequentially and continuously with a ribbon, the case where the ribbon breaks in the middle or is not properly bonded leads to a defect in the entire solar battery module product, and thus, the tabbing process is a significant stage that determines the quality of the module. In order to perform the above tabbing process, a quantity of solar battery cells capable of implementing a desired output are arranged in rows and columns in a rectangular plate shape on an upper surface of tabbing equipment. Here, for each individual battery, a soldering flux is coated onto portions of an upper portion and a lower portion of a cell onto which a ribbon is to be attached, and a ribbon wire is placed on an electrode onto which the flux is coated. In this state, the ribbon is fixed to each unit solar battery by soldering contact portions in various methods. During this process, soldering may be performed manually by a person or automatically by a machine. The case where soldering is performed automatically by the machine may also be divided into hot air, laser, induction, IR lamp, and resistance heating methods according to methods thereof.

The laser, induction, and resistance heating methods have the shortcomings in which, instead of locally transferring heat, and minimizing and concentrating the range thereof, process equipment capable of implementing the same is high-priced, and the hot air and IR lamp methods refer to methods of transferring energy by using hot air, or radiant heat of the sun, have the strong points of a wide heat transfer range, and have the shortcomings of transferring more heat than needed for a solar battery.

However, a tabbing device according to the related art has an issue in which, in the case where the tabbing device stops for several causes, a hot lamp is positioned above a cell for which soldering is completed, and thus, over-soldering occurs on a back surface which is the most vulnerable points of the cell. To solve the same, a height of an Ag pad of a cell is adjusted or cooling equipment is applied, but in this case, there are issues such as increased cell cost, soldering temperature destruction, reduced lamp life, and increased air consumption. In addition, in the case where the tabbing device stops and then restarts and thus cells move, there is an issue in which under-soldering due to temperature deficiency occurs in several cells subsequent to a position of the tabbing device.

DISCLOSURE

Technical Problem

According to the present disclosure, provided is a tabbing device for manufacturing a solar battery module, which may solve a soldering temperature deficiency phenomenon by a cooling equipment when the tabbing device stops.

Technical Solution

A tabbing device for manufacturing a solar battery module, according to an aspect of the present disclosure, may include: a solar battery module cell transported by cell unit along conveyor transport equipment; a soldering head provided on an upper side of the solar battery module cell and having embedded therein a heat source configured to provide heat to solder flux coated on the solar battery module cell being transported; a cooling unit installed to be positioned outside the soldering head, and configured to discharge cooling fluid to a lower position of the soldering head and cool the soldering head; and a control unit configured to control operations of the cooling unit and the soldering head in a case where transportation of the solar battery module cell is stopped, wherein, when restarting, the control unit controls a temperature of the heat source until all of solar battery module cells in an offset section pass through a lower part of the soldering head.

Here, the tabbing device may include the control unit configured to control the operations of the cooling unit and the soldering head in the case where the transportation of the solar battery module cell is stopped, wherein, when the transportation of the solar battery module cell is stopped, the control unit may operate the cooling unit to provide the cooling fluid and when restarting, stop the operation of the cooling unit and control the temperature of the heat source to be increased to a predetermined temperature until all of the solar battery module cells in the offset section pass through the lower part of the soldering head.

Here, when restarting, the control unit may control, in addition to the heat source, a soldering time for which the solar battery module cells in the offset section are exposed to the heat source and soldered under the soldering to be increased.

Here, the control unit may return the temperature of the heat source and the soldering time to original states after all of the solar battery module cells in the offset section pass through the soldering head.

Here, the cooling unit may include: a cooling fluid supply unit configured to provide the cooling fluid; a nozzle unit installed adjacent to the outside of the soldering head and configured to discharge the cooling fluid; and a connection hose connecting the cooling fluid supply unit and the nozzle unit.

Here, the nozzle unit may include a metal material, and the connection hose may include a material which allows an adjusted state to be maintained, enabling a direction of the nozzle unit to be adjusted.

Here, the nozzle unit may include an air nozzle, and the cooling fluid may include air.

Here, the tabbing device may further include a driving unit configured to reciprocally transport the soldering head in a movement direction of a conveyor, wherein the driving unit is controlled by the control unit.

Here, the heat source of the soldering head may include an infrared lamp.

Here, when the transportation of the solar battery module cell is stopped, the control unit may control the driving unit to move the heat source from a first position of a first cell positioned and soldered under the heat source from among solar battery module cells to a second position, which is a position of one cell from among adjacent waiting cells, while the cooling unit does not operate and when the transportation of the solar battery module cell is restarted, control the driving unit to return the heat source from the second position to the first position.

Advantageous Effects

According to the above components, a tabbing device for manufacturing a solar battery module, according to the present disclosure, may prevent over-soldering of a solar battery module cell positioned under a soldering head by operating cooling equipment when transportation of the solar battery module cell is stopped and also prevent under-soldering by increasing a soldering temperature and a soldering time for the solar battery module cell in an offset section when restarting.

DESCRIPTION OF DRAWINGS

FIG. 3 is schematic diagrams illustrating an operation when stopping and an operation when restarting.

MODE FOR INVENTION

Figure 1:
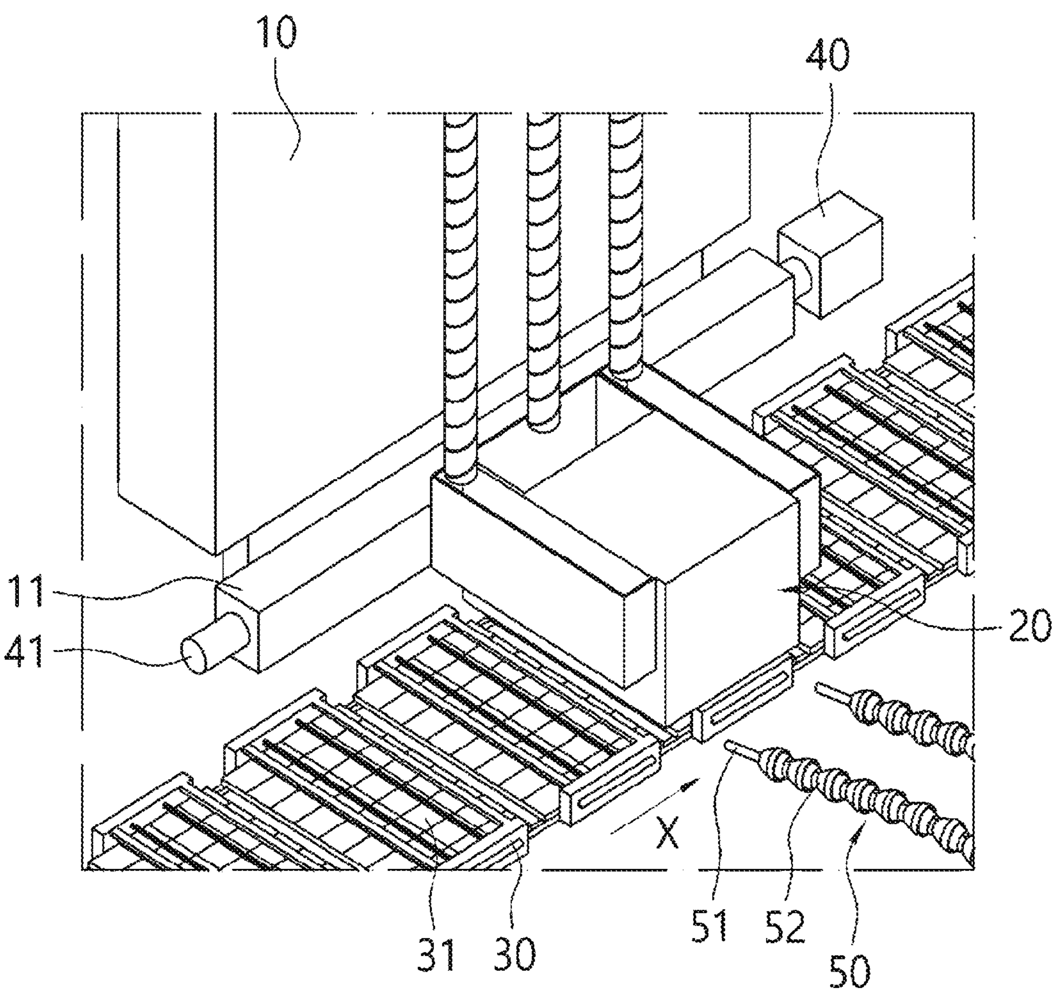
FIG. 1 is a perspective view of a tabbing device for manufacturing a solar battery module, according to an embodiment of the present disclosure.

The words and terms used in the description and claims should not be interpreted as being limited to common or dictionary meanings, and should be interpreted as meanings and concepts that conform to the spirit of the present disclosure on the basis of the principle that the inventor may define the terms and the concepts to describe his or her own invention in the best way.

Therefore, embodiments described in the description and components illustrated in the drawings are only an example embodiment of the present disclosure and do not represent all of the spirit of the present disclosure, and thus, various equivalents and modified examples capable of replacing the corresponding component may be made at the time of filing the present application.

It should be understood that the terms such as “comprise” or “have” when used herein, specify the presence of stated features, numbers, steps, operations, elements, components, or combinations thereof, but do not preclude the presence or addition of one or more other features, numbers, steps, operations, elements, components, or combinations thereof.

When a component is referred to as being “in front of”, “behind”, “above”, or “under” another component, unless there are particular circumstances, the component is not only arranged “in front of”, “behind”, “above”, or “under” the other component in direct contact with the other component, but also another component is arranged in between. In addition, when any component is referred to as being “connected” to another component, unless there are particular circumstances, the components are not only directly connected to each other but also indirectly connected to each other.

Hereinafter, a tabbing device for manufacturing a solar battery module, which prevents over-soldering, according to an embodiment of the present disclosure, is described with reference to the drawings.

Referring to FIGS. 1 to 5, a tabbing device for manufacturing a solar battery module, which prevents over-soldering, according to an embodiment of the present disclosure, may include a solar battery module cell 31, a soldering head 20, a cooling unit 50, a driving unit 40, and a control unit.

Referring to FIGS. 1 to 5, the solar battery module cell 31 may be transported by cell unit along a conveyor 30.

Here, the control unit adjusts a speed of the conveyor 30 as pre-programmed. Under control of the control unit, the conveyor 30 is operated, and as a result, a time for a heat source provided to the solar battery module cell 31 is determined and soldering may be appropriately performed accordingly.

Here, the solar battery module may be transported by cell unit along the conveyor 30, and to form the solar battery module, a soldering flux is coated onto the solar battery module cell 31 to electrically connect the solar battery module cell 31. The flux is soldered by the heat source.

Figure 2:
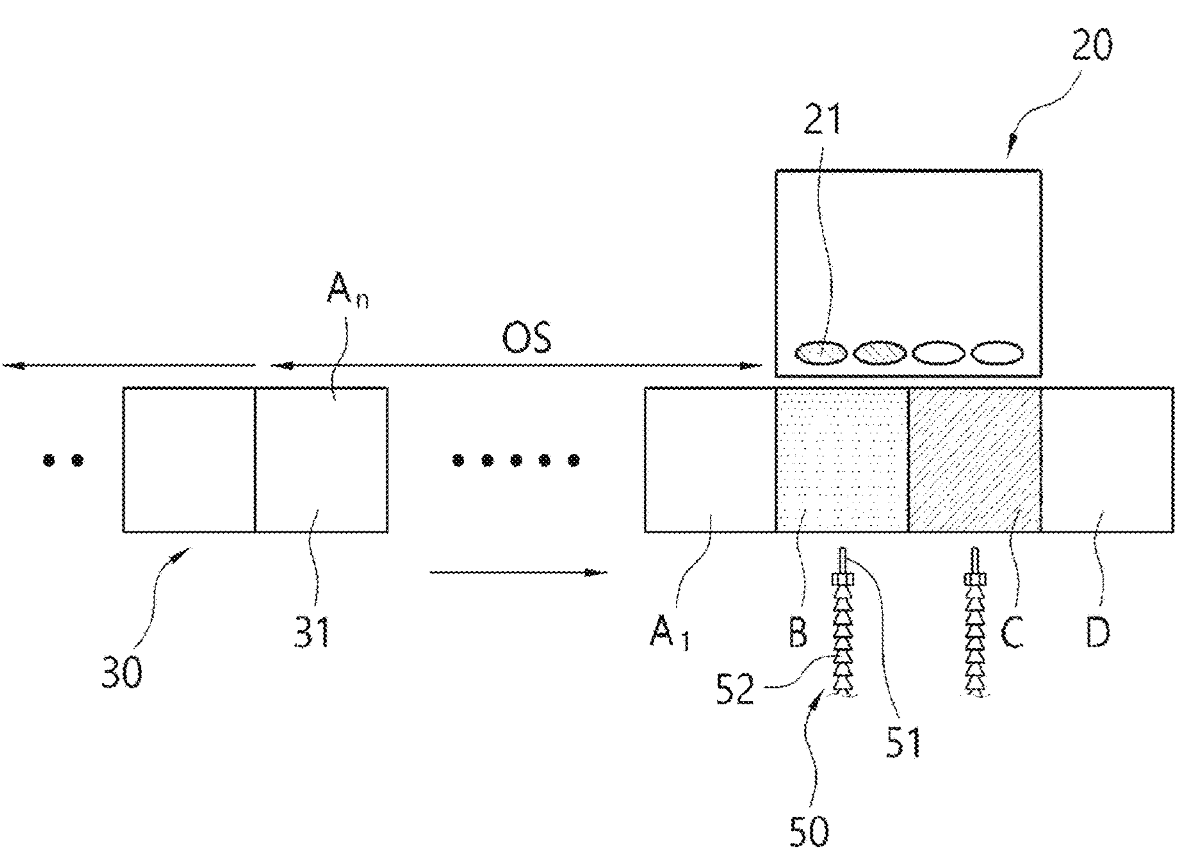
FIG. 2 is a schematic diagram illustrating an operation of a tabbing device for manufacturing a solar battery module, according to an embodiment of the present disclosure.

Referring to FIGS. 1 and 2, the soldering head 20 may be installed on an upper side of the solar battery module cell 31 and may have embedded therein the heat source for providing heat to solder the flux coated onto the solar battery module cell 31 being transported.

Here, the soldering head 20 is generally fixed to a frame 10 of the entire device and does not move. Therefore, in the case where the conveyor 30 stops during operation, over-soldering occurs in the solar battery module cell 31 positioned under the heat source. Here, in the present disclosure, the control unit has a structure that may move a position of the soldering head 20.

Here, an infrared (IR) lamp 21, which is the heat source, is installed in the soldering head 20, many other components for soldering are installed, and an air nozzle may be installed inside or a ventilation device may be installed to provide air directly from the inside for temperature control.

Here, the soldering head 20 may be supported by a straight guide 11 of the frame 10 to be guided and transported. Here, the straight guide 11 is fixedly installed on the frame 10, a guide rod 41 is inserted into the straight guide 11, and the guide rod 10 is connected to the soldering head 20. Therefore, the soldering head 20 may be driven in a straight direction according to a guidance of the straight guide 11.

Referring to FIGS. 1 and 2, the cooling unit 50 may be installed to be positioned outside the soldering head 20, and may discharge a cooling fluid to a lower position of the soldering head 20 and cool the same.

Here, the cooling unit 50 may include a cooling fluid supply unit, a nozzle unit 51, and a connection hose 52.

Here, the cooling fluid supply unit may provide the cooling fluid.

Here, the nozzle unit 51 may be installed adjacent to the outside of the soldering head 20 and discharge the cooling fluid.

Here, the connection hose 52 may connect the cooling fluid supply unit and the nozzle unit 51, and the cooling fluid may flow in communication therethrough.

Here, the nozzle unit 51 may include a metal material, and the connection hose 52 may include a material which allows an adjusted state to be maintained, enabling a direction of the nozzle unit 51 to be adjusted. The nozzle unit 51 is arranged at a position adjacent to the heat source and thus a material thereof needs to be selected by considering deformation or the like due to heat, and the connection hose 52 may apply a material or a similar structure having plasticity, which may be bent to adjust a direction thereof and maintain the state thereof to adjust a direction of the fluid discharged through the nozzle unit 51.

Here, the nozzle unit 51 may include an air nozzle, and the cooling fluid may include air. In general, the fluid discharged to the nozzle unit 51 to cool the soldering head 20 may use air that takes the least cost. In some cases, an inert gas or the like may be applied.

Referring to FIG. 2, in the case where the transportation of the solar battery module cell 31 is stopped, the control unit may control operations of the cooling unit 50, the soldering head 20, and the lamp 21.

Here, when the transportation of the solar battery module cell 31 is stopped, the control unit operates the cooling unit 50 to provide the cooling fluid, and when restarting, may stop the operation of the cooling unit 50 and control a temperature of the heat source to be raised to a predetermined temperature until all of solar battery module cells $A_1$ to $A_n$ in a predetermined offset section OS pass through the lower part of the soldering head 20.

Here, the control unit may control, together with the heat source, when restarting, a time for which the solar battery module cells $A_1$ to $A_n$ in the offset section OS is exposed to the heat source and soldered under the soldering head 20 to be increased. In other words, the control unit may increase a time for soldering each of the solar battery module cells $A_1$ to $A_n$ by controlling a speed of the conveyor 30 to be reduced.

In other words, as an example of applying an offset, when the soldering head 20 stops and then restarts, power of the infrared lamp 21 provided to twenty-one solar battery module cells 31 may be more increased by a certain amount than an existing amount, and at the same time, a time for providing the power of the infrared lamp 21 may be more increased than an existing time.

Here, the control unit may return the temperature of the heat source and a soldering time to original states after all of the solar battery module cells $A_1$ to $A_n$ in the offset section OS pass through the soldering head 20. Here, at the same time, the control unit may control the cooling unit 50 to be turned off.

Accordingly, under-soldering may be prevented in advance from occurring under control of the control unit.

Referring to FIG. 1, the driving unit 40 may reciprocally transport the soldering head 20 in a movement direction of the conveyor 30.

At this time, the driving unit 40 may use a cylinder method herein. In addition, a linear drive method using a motor, screw, or nut type may also be used.

Referring to FIGS. 1 to 5, the control unit may control the driving unit 40.

Here, when the tabbing device stops, the control unit may control the driving unit 40 to move the heat source from a first position B of a first cell, which is positioned and soldered under the heat source, from among the solar battery module cells 31, to a second position A which is a position of one cell from among adjacent waiting cells.

Here, the control unit may control the driving unit 40 so that the heat source is positioned in a second cell closest to the first cell from among the waiting cells.

Here, the control unit may control the driving unit 40 so that the heat source returns from the second position A to the first position B, when the tabbing device is restarted.

Here, the control unit controls the position of the soldering head 20, i.e., in the case where the conveyor 30 is eventually stopped due to an external environment or other causes, controls the soldering head 20 to move from the first position B to the second position A, which is a waiting cell, by one cell and when restarting, return to the first position B, which is the original position, by one cell.

Here, the control unit may control the infrared lamp 21 to be turned off from when the tabbing device stops to when the tabbing device restarts.

Here, in the case where the control unit controls the driving unit 40 to move the soldering head 20, the control unit may perform the above work while stopping the operation of the cooling unit 50.

FIG. 1 illustrates that the tabbing device for manufacturing a solar battery module, according to an embodiment of the present disclosure, is in a normal operation state. A plurality of solar battery module cells 31 move in a direction X of the conveyor 30 by an operation of the conveyor 30 while seated on the conveyor 30 at regular intervals. Here, the soldering head 20 is positioned at the first position B, and each solar battery module cell 31 being transported may be soldered by the heat source of the infrared lamp 21 at the first position B and then may be continuously moved for subsequent work. The cooling unit 50 is arranged so that the nozzle unit 51 is adjacent to the lower end portion of the soldering head 20, and air, which is the cooling fluid, may be sprayed through the nozzle unit 51 to cool the portion.

FIG. 2 illustrates a schematic diagram for describing the operation of the tabbing device for manufacturing a solar battery module, according to an embodiment of the present disclosure. The soldering head 20 is in a stop state above solar battery module cells B and C. A solar battery module cell D is in a state after passing through the soldering head 20 while already soldered. Here, the control unit operates the cooling unit 50 until the soldering head 20 restarts. The cooling fluid is supplied from the nozzle unit 51 to the lower part of the soldering head 20 to perform cooling, and as a result, over-soldering of the solar battery module cells B and C under the soldering head 20 may be prevented. However, here, a temperature of the heat source supplied to a solar battery module cell positioned under the soldering head 20 is lower than the normal temperature by cooling. When the soldering head 20 restarts, the control unit increases the temperature of the infrared lamp 21, which is the heat source of the soldering head 20, to a predetermined temperature and reduces the speed of the conveyor 30 to perform work while increasing a time for which a solar battery module cell is exposed to the heat source. Here, soldering work under the above conditions is performed only for the solar battery module cells positioned in the offset section OS from $A_1$ to $A_n$, prior to passing under the soldering head 20 and subsequently, the control unit controls normal work conditions to be applied.

Figure 3:
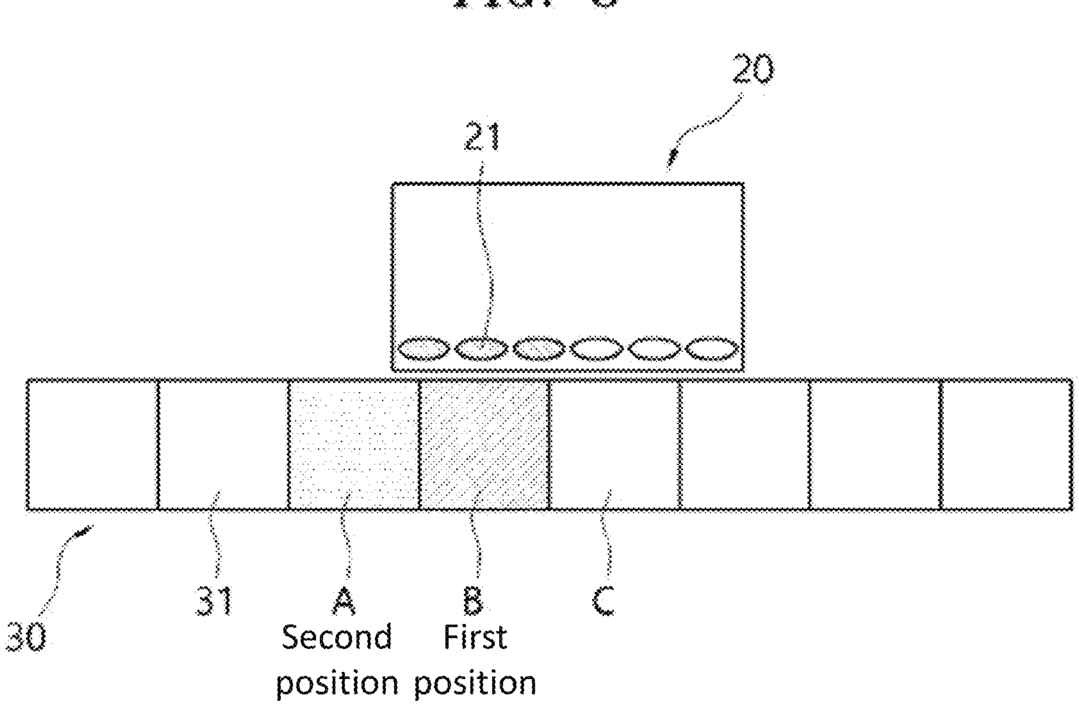
FIGS. 3 and 4 are schematic diagrams illustrating other operations of a tabbing device for manufacturing a solar battery module, according to an embodiment of the present disclosure, i.e.
Figure 4:
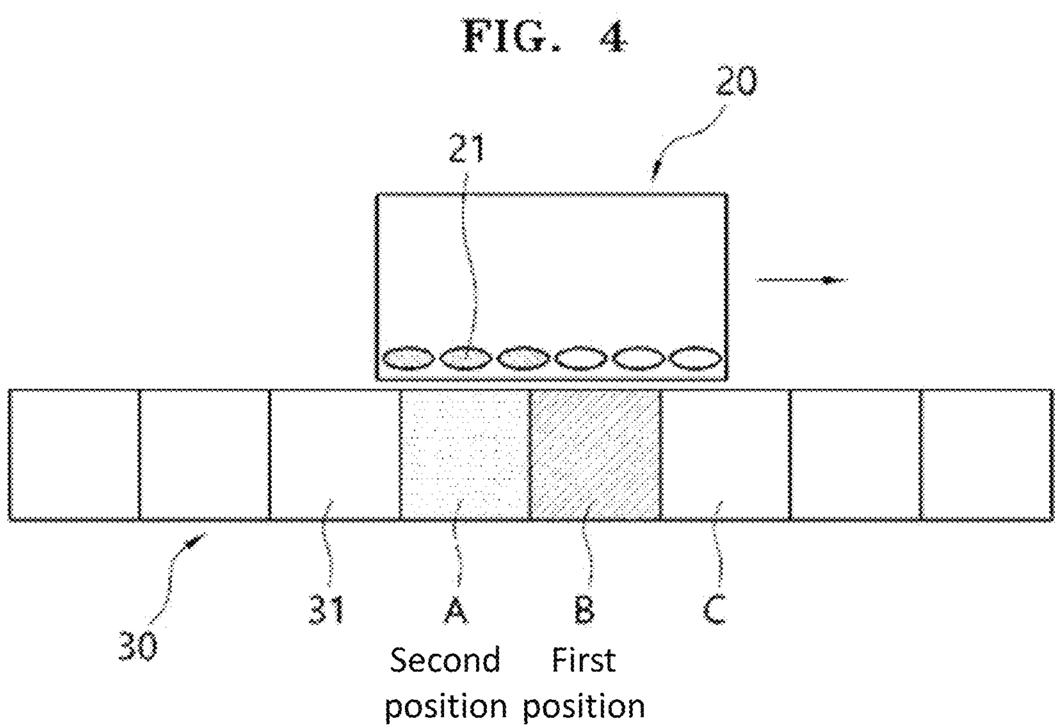

FIGS. 3 and 4 are schematic diagrams illustrating other operations of a tabbing device for manufacturing a solar battery module, according to an embodiment of the present disclosure, i.e., FIG. 3 illustrates schematic diagrams for describing an operation when a soldering head 20 stops and an operation when the soldering head 20 restarts. Controlling by the above method is a method that may prevent over-soldering of a solar battery module cell under the soldering head 20 when the soldering head 20 stops. In other words, in the case where the tabbing device stops for any cause, the control unit recognizes the same and operates the driving unit 40. By an operation of the driving unit 40, the soldering head 20 moves backward in a direction of the conveyor 30 from a first position B to a second position A. At the same time, the control unit controls the lamp 21 to be turned off. Accordingly, the soldering head 20 is positioned above a closest cell from among waiting cells and preheats a waiting cell positioned at the second position A. At the same time, air may be sprayed from the cooling unit 50 to cool a cell at the first position B. In the case where an issue in which the device is stopped is solved and restarts, the control unit detects the same and controls the driving unit 40 to return the soldering head 20 to the first position B that is an original position. By the operation of the driving unit 40, the soldering head 20 returns from the second position A to the first position B, and the control unit controls the lamp 21 to be turned on. In the case where the soldering head 20 returns and the lamp 21 is turned on, work is performed as usual.

Over-soldering prevention work due to the movement of the soldering head 20 described above is performed for a certain time from when the soldering head 20 stops, and then a normal state returns in the case where the cause for the stop is resolved, but in the case where the stop continues for a certain time or longer, control may be performed by under-soldering prevention work using an offset section described above.

Although the embodiments of the present disclosure have been described, the spirit of the present disclosure is not limited by the embodiments presented in the description, and those skilled in the art who understand the spirit of the present disclosure will be able to easily propose other embodiments by supplementing, changing, deleting, or adding components within the scope of the same spirit, but the same will also be considered to fall within the spirit of the present disclosure.

The invention claimed is:

1. A tabbing device for manufacturing a solar battery module, the tabbing device comprising:

a soldering head provided on an upper side of a solar battery module cell and having embedded therein a heat source configured to provide heat to solder flux coated on the solar battery module cell being transported;

a cooling unit installed to be positioned outside the soldering head, and configured to discharge cooling fluid to a lower position of the soldering head and cool the soldering head; and a control unit configured to control operations of the cooling unit and the soldering head, wherein the control unit is further configured to, upon restarting transportation of the solar battery module cell after the transportation is stopped, control a temperature of the heat source until all of the solar battery module cells positioned in an offset section prior to passing under the soldering head have passed under the soldering head, wherein the control unit is further configured to operate the cooling unit to provide the cooling fluid while the transportation of the solar battery module cell is stopped; and upon restarting the transportation of the solar battery module cell, stop the operation of the cooling unit and control the temperature of the heat source to be increased to a predetermined temperature until all of the solar battery module cells positioned in the offset section prior to passing under the soldering head have passed under the soldering head.

2. The tabbing device of claim 1, wherein the control unit is further configured to, upon restarting the transportation of the solar battery module cell, increase a soldering time for which the solar battery module cells previously positioned in the offset section prior to passing under the soldering head are exposed to the heat source while being soldered under the soldering head.

3. The tabbing device of claim 1, wherein the control unit is further configured to return the temperature of the heat source and the soldering time to original states after all of the solar battery module cells positioned in the offset section prior to passing under the soldering head have passed under the soldering head.

4. The tabbing device of claim 1, wherein the cooling unit comprises:

a cooling fluid supply unit configured to provide the cooling fluid;

a nozzle unit installed adjacent to the outside of the soldering head and configured to discharge the cooling fluid; and a connection hose connecting the cooling fluid supply unit and the nozzle unit.

5. The tabbing device of claim 4, wherein the nozzle unit comprises a metal material, and the connection hose comprises a material which allows an adjusted state to be maintained, enabling a direction of the nozzle unit to be adjusted.

6. The tabbing device of claim 4, wherein the nozzle unit comprises an air nozzle, and the cooling fluid comprises air.

7. The tabbing device of claim 1, further comprising a driving unit configured to reciprocally transport the soldering head in a movement direction of a conveyor, wherein the driving unit is controlled by the control unit.

8. The tabbing device of claim 1, wherein the heat source of the soldering head comprises an infrared lamp.

9. The tabbing device of claim 7, wherein the control unit is further configured to:

while the transportation of the solar battery module cell is stopped and the cooling unit is inactive, control the driving unit to move the heat source from a first position corresponding to a cell being soldered among the solar battery module cells to a second position corresponding to a waiting cell positioned in the offset section; and upon restarting the transportation of the solar battery module cell, control the driving unit to return the heat source from the second position to the first position.

* * * * *